US008154092B2

(12) United States Patent
Melzak et al.

(10) Patent No.: US 8,154,092 B2
(45) Date of Patent: Apr. 10, 2012

(54) SILICON CARBIDE MEMS STRUCTURES AND METHODS OF FORMING THE SAME

(75) Inventors: Jeffrey M. Melzak, South Euclid, OH (US); Chien-Hung Wu, Parma Heights, OH (US)

(73) Assignee: Case Western Reserve University, Cleveland, OH (US)

( * ) Notice: Subject to any disclaimer, the term of this patent is extended or adjusted under 35 U.S.C. 154(b) by 1357 days.

(21) Appl. No.: 10/914,468

(22) Filed: Aug. 9, 2004

(65) Prior Publication Data

US 2006/0027884 A1 Feb. 9, 2006

(51) Int. Cl.
*H01L 29/82* (2006.01)

(52) U.S. Cl. ......... 257/414; 257/415; 257/77; 257/678

(58) Field of Classification Search ............ 257/414, 257/415, 77, 678
See application file for complete search history.

(56) References Cited

U.S. PATENT DOCUMENTS

| | | | |
|---|---|---|---|
| 4,437,109 A | 3/1984 | Anthony et al. | |
| 5,165,283 A | 11/1992 | Kurtz et al. | |
| 5,511,428 A | 4/1996 | Goldberg et al. | |
| 5,637,905 A | 6/1997 | Carr et al. | |
| 5,693,577 A | 12/1997 | Krenik et al. | |
| 5,759,908 A | 6/1998 | Steckl et al. | |
| 6,031,944 A | 2/2000 | Youngner | |
| 6,197,664 B1 | 3/2001 | Lee et al. | |
| 6,252,300 B1 | 6/2001 | Hsuan et al. | |
| 6,327,911 B1 | 12/2001 | Kurtz et al. | |
| 6,352,923 B1 | 3/2002 | Hsuan et al. | |
| 6,468,889 B1 | 10/2002 | Iacoponi et al. | |
| 6,483,147 B1 | 11/2002 | Lin | |
| 6,521,923 B1 | 2/2003 | D'Anna et al. | |
| 6,521,965 B1 | 2/2003 | Lutz | |
| 6,530,282 B1 | 3/2003 | Kurtz et al. | |
| 6,559,530 B2 | 5/2003 | Henzel et al. | |
| 6,624,003 B1 | 9/2003 | Rice et al. | |
| 6,961,245 B2 * | 11/2005 | Ikuta et al. | 361/719 |

FOREIGN PATENT DOCUMENTS

EP 0890987 1/1999
WO WO 03/076330 9/2003

OTHER PUBLICATIONS

"Transducers for the Automotive Test Industry"; Kulite Semiconductor Products, Inc.
Guo, S. et al., "A Monolithically Integrated Surface Micromachined Touch Mode Capacitive Pressure Sensor," Sensors and Actuators 80:224 (2000).
Kulite bulletin.
Melzak, J., "Silicon Carbide for RF MEMS," IEEE International Microwave Symposium, Philadephia, PA, Jun. 8-13, 2003.
Sarro, P., "Silicon carbide as a new MEMS technology", Sensors and Actuators 82 (2000) 210-218.
International Search Report, from PCT/US2005/028336, mailed Nov. 25, 2005.

* cited by examiner

*Primary Examiner* — Long Pham
(74) *Attorney, Agent, or Firm* — DeMont & Breyer, LLC

(57) ABSTRACT

MEMS structures that include silicon carbide micromechanical components, as well as methods of forming and using the same, are provided. The silicon carbide micromechanical components may be integrated on the same structure with electronic components that control or detect movement of the micromechanical components. MEMS structures of the invention may be used in a variety of applications including microsensor and microactuator applications.

13 Claims, 7 Drawing Sheets

SILICON CARBIDE MEMS STRUCTURES AND METHODS OF FORMING THE SAME

FIELD OF INVENTION

The invention relates generally to microelectromechanical systems (MEMS) and, more particularly, to MEMS structures that include silicon carbide mechanical components and methods of forming the same.

BACKGROUND OF INVENTION

Microelectromechanical systems (MEMS) include mechanical and electrical components having dimensions on the order of microns or smaller. MEMS structures are used in numerous applications including microsensors and microactuators.

Microsensors can be used to sense and/or measure pressure, flow, acceleration, temperature and stress, amongst other conditions. A microsensor functions by generating electrical signals in response to movements of a mechanical component of the sensor. The sensor may be calibrated such that the electrical signal and, thus the movement of the mechanical component, is correlated to the condition.

Microactuators include one or more mechanical components (e.g., valves, beams, diaphragms, and mirrors) which are moved to perform a desired function. Complex microactuators structures may include multiple movable mechanical components, for example, to form a micromotor. A microactuator functions in a manner opposite, in some regard, to that of a microsensor by converting an electrical signal to a mechanical movement.

MEMS structures may be formed using microelectronic fabrication processes. In a typical process, deposition steps are used to deposit layers which are subsequently patterned using lithographic and etching steps to form the desired mechanical and electrical components. Other conventional processing steps, such as ion implantation, may also be employed if necessary.

Because microelectronic fabrication processes can be used to form MEMS structures, mechanical and electrical components of the structures are oftentimes formed of silicon. However, one disadvantage of silicon-based MEMS structures is the loss of performance under extreme conditions such as high temperatures, corrosive environments, or rapid vibrations. Under such conditions, the mechanical properties of silicon may be degraded so that the mechanical components cannot perform their desired function. Also, silicon becomes extrinsic at temperatures above 150° C. and, thus, loses its ability to function as a semiconductor material at such temperatures.

SUMMARY OF INVENTION

MEMS structures, as well as methods of forming and using the same, are provided.

In one aspect of the invention, a MEMS structure is provided. The structure comprises a substrate, a micromechanical component comprising silicon carbide formed on a first side of the structure and at least one electronic component formed on a second side of the structure. The structure further comprises a conductive pathway extending through the substrate to connect the micromechanical component to the at least one electronic component.

In another aspect of the invention, a method of forming a MEMS structure is provided. The method comprises forming a micromechanical component comprising silicon carbide on a first side of the structure and forming at least one electronic component on a second side of the structure. The method further comprises forming a conductive pathway extending through a substrate of the structure to connect the micromechanical element to the at least one electronic component.

In another aspect of the invention, a MEMS structure is provided. The structure comprises a substrate, a micromechanical component comprising polycrystalline silicon carbide and at least one electronic component electrically connected to the micromechanical component. The at least one electronic component is capable of controlling or detecting movement of the micromechanical component.

In another aspect of the invention, a method of forming a MEMS structure is provided. The method comprises forming a micromechanical component comprising polycrystalline silicon carbide on a first side of the structure and forming at least one electronic component on a second side of the structure. The method further comprises forming a conductive pathway to connect the micromechanical element to the at least one electronic component. The at least one electronic component is capable of controlling or detecting movement of the micromechanical component.

In another aspect of the invention, a method of operating an integrated MEMS structure is provided. The method comprises operating an integrated MEMS structure at a temperature of greater than about 125° C. The structure comprises a substrate, a micromechanical component comprising polycrystalline silicon carbide, and at least one electronic component electrically connected to the micromechanical component. The micromechanical component is capable of controlling or detecting movement of the micromechanical component.

Other aspects, embodiments and features of the invention will become apparent from the following detailed description of the invention when considered in conjunction with the accompanying drawings. All patent applications and patents incorporated herein by reference are incorporated by reference in their entirety. In case of conflict, the present specification, including definitions, will control.

BRIEF DESCRIPTION OF DRAWINGS

The accompanying drawings, are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

The invention is directed to MEMS structures that include silicon carbide micromechanical components, as well as methods of forming and using the same. The silicon carbide micromechanical components may be integrated on the same structure with electronic components that control or detect movement of the micromechanical components. MEMS structures of the invention may be used in a variety of applications including microsensor and microactuator applications.

Figure 1A:
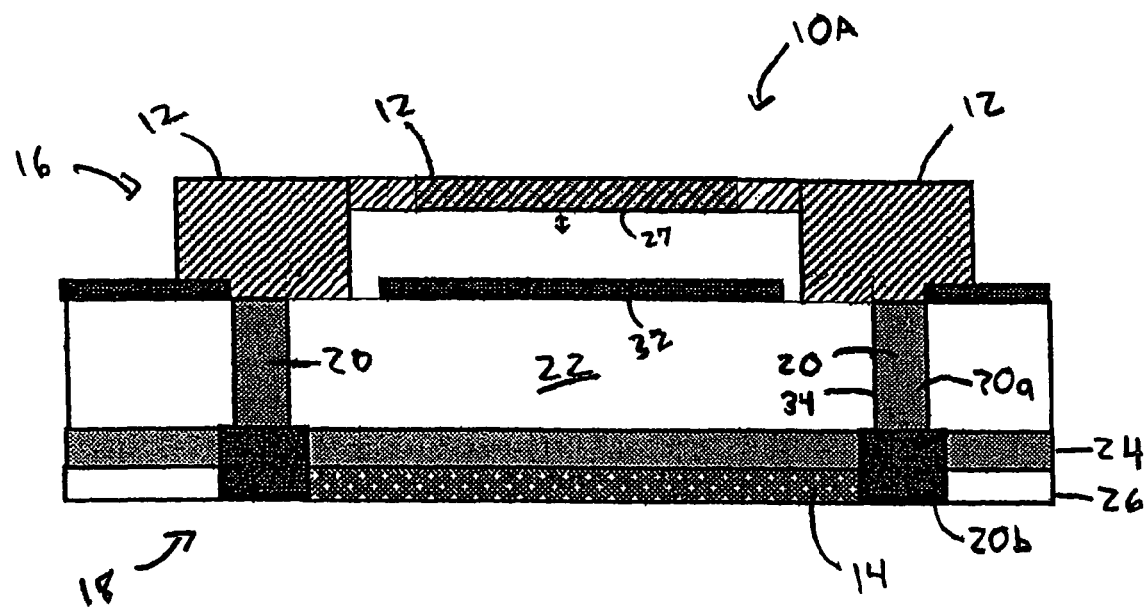
FIG. 1A shows a cross-section of a microsensor according to one embodiment of the present invention.
Figure 2:
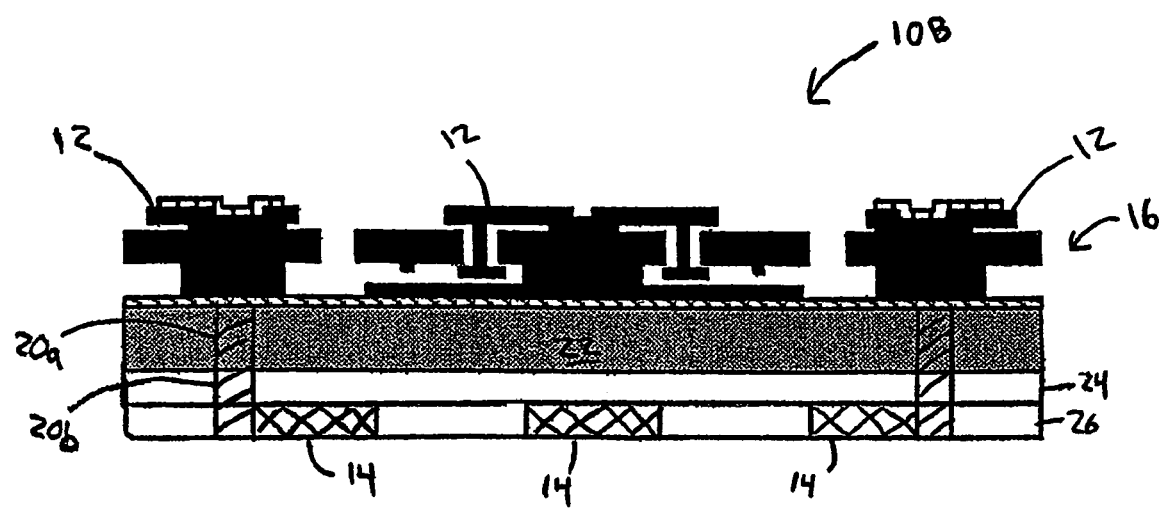
FIG. 2 shows a cross-section of a microactuator according to one embodiment of the present invention.

FIGS. 1A and 2 show respective MEMS structures 10A and 10B according to embodiments of the present invention. MEMS structure 10A in FIG. 1A is a microsensor and MEMS structure 10B in FIG. 2 is a microactuator. The MEMS structures include micromechanical components 12 integrated with electronic components 14. In the illustrative embodiments, the micromechanical components are formed on a frontside 16 of the structure and the electronic components are formed on a backside 18 of the structure. As described further below, electrical connections 20 may be formed in vias 34 that extend through a substrate 22 to connect the micromechanical components and the electronic components, thus, enabling electrical signals to pass therebetween. Advantageously, the micromechanical components may be formed of silicon carbide which has excellent mechanical properties, even at high temperatures and/or at other extreme conditions.

Substrate 22 may be any suitable substrate known in the art. In the embodiment shown in FIGS. 1A and 2, the substrate is a silicon-on-insulator (SOI) material that includes a buried insulator (e.g., silicon oxide) region 24 formed beneath a silicon surface region 26. As described further below, electronic components 14 may be formed in the silicon surface region. The presence of the buried insulator region advantageously enables the operation of the electronic components at high temperatures, such as up to about 300° C. (e.g., between about 150° C. and about 300° C.).

Other suitable substrates include silicon, sapphire and silicon carbide-based substrates (e.g., silicon carbide, silicon carbide-on-insulator, and silicon carbide-on-sapphire), amongst others. Silicon carbide-based substrates enable operation of the electronic components at extremely high temperatures, such as up to about 600° C. (e.g., between about 300° C. and about 600° C. or between about 500° C. and about 600° C.).

Electrical connections 20 provide a conductive pathway from micromechanical components 12 to electronic components 14. As shown, the electrical connections include a first portion 20a that extends through the majority of the substrate and a second portion 20b that connects the electronic components to the first portion. In the illustrative embodiments that include an SOI substrate, the second portion extends through silicon surface region 26 and buried insulator region 24, while the first portion extends through the remainder of the substrate. In some cases, it may be preferable for the electrical connections to include a first portion that extends from frontside 16 and a second portion that extends from backside 18, for example, to facilitate processing.

It should be understood that, in other embodiments, the electrical connections may be formed of a single portion that extends through the substrate from the micromechanical components to the electronic components. In some cases, electrical connections may be formed on sides of the structure and, thus, do not extend through the substrate. In other cases, the electronic components may be positioned proximate to the micromechanical components (e.g., when the electronic and mechanical components are not on opposites sides of the structure) and separated by a conducting region within the substrate that provides the conducting pathway.

Electrical connections 20 may be formed of suitable conductive materials including metals, metal compounds or doped semiconductor materials (e.g., doped SiC and doped Si). Examples of suitable metals include tungsten, nickel, and combinations thereof. In some embodiments, it may be advantageous to deposit a non-conducting layer (e.g., silicon oxide, silicon nitride, titanium nitride) on sidewalls of the via prior to depositing the electrical connection. The non-conducting layer may electrically insulate the electrical connection. The non-conducting layer may also prevent diffusion of the connection during operation which may otherwise arise, particularly in embodiments that include metal connections and involve operating at higher temperatures (e.g., between about 300° C. and about 600° C.).

In cases when the electrical connections include a first portion 20a and a second portion 20b, as shown and discussed above, the first portion may be formed of a first conductive material and the second portion may be formed of a second conductive material. In other cases, the first portion and the second portion may be formed of the same conductive material.

In the illustrative embodiment, micromechanical components are formed on frontside 16 of the structure. Such a construction facilitates exposing the micromechanical component to the environment which can be advantageous, or even necessary, during use. For example, in embodiments when the MEMS structure is a sensor, positioning the micromechanical component on the frontside of the structure enables the component to be exposed to the environment (e.g., a fluid) being characterized. In other cases, the micromechanical components (or at least a portion of the micromechanical components) may be positioned in other regions of the structure (e.g., internal of the structure).

As noted above, micromechanical components 12 may be formed of silicon carbide. In certain preferred embodiments, the micromechanical components are formed of polycrystalline silicon carbide. Polycrystalline structures include a plurality of randomly oriented crystallites which is different than a single crystal structure. As described further below, it may be preferable to use polycrystalline silicon carbide in methods of the invention to facilitate formation of the micromechanical components. For example, polycrystalline silicon carbide may be processed at lower temperatures than single crystal silicon carbide. The polycrystalline silicon carbide may have a face centered cubic structure (i.e., Beta phase).

It should also be understood that in some embodiments, the micromechanical components may be formed of single crystal silicon carbide.

Silicon carbide micromechanical components are characterized by having excellent mechanical properties (e.g., modulus, hardness), an ability to withstand elevated temperatures (e.g., at least 600° C.) and inertness to corrosion from most chemicals and environments. As described further below, these advantages help enable MEMS structures of the present invention to be used in extreme environments in which certain conventional MEMS structures (e.g., silicon-based MEMS structures) cannot operate, as described further below.

A wide variety of different designs of micromechanical components 12 may be used in MEMS structures of the present invention and the specific design of the components depends on the application of the MEMS structure. The micromechanical components include at least one, and in some cases more than one, moveable component. Typical examples of the moveable component include diaphragms, floating plates, and beams, amongst others. In the microsensor embodiment shown in FIG. 1A, the movable component is a diaphragm 27 that moves (e.g., in the direction of the arrow) in response to the condition being measured (e.g., pressure). In the microactuator application shown in FIG. 2, the movable component forms a rotating element of a micromotor.

In the illustrative embodiment, electronic components 14 are formed on a backside of the structure. Positioning the electronic components on the opposite side of the structure as the micromechanical components, as shown, may facilitate processing and optimize use of substrate area, amongst other advantages. However, it should be understood that, in other embodiments of the invention, the electronic components may be formed within other regions of the MEMS structure (i.e., not at the back surface). For example, the electronic components may be formed proximate (e.g., in a region under) the micromechanical components. In these embodiments, a conducting region within the substrate may electrically connect the electronic and micromechanical components. In some cases, the electronic components may be formed on the same side of the structure as the micromechanical components. In certain embodiments, electronic components may be formed on the same and opposite sides of the structure as the micromechanical components.

Electronic components 14 comprise one, or more typically, a series of semiconductor devices that are designed and arranged to perform a desired electronic function which depends on the application of the MEMS structure. Suitable devices and arrangements (e.g., circuits) are known to those of ordinary skill in the art. In some embodiments, the devices may be based on MOSFET and/or BJT and/or JFET technology.

Figure 1B:
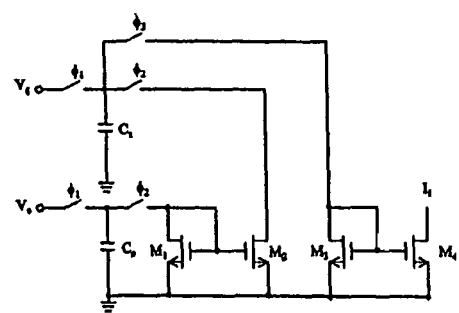
FIG. 1B shows a circuit diagram representative of the arrangement of electronic components on a capacitive microsensor according to one embodiment of the present invention

The electronic components may detect changes in a property and convert those changes to an electrical signal which may be further processed as described further below. For example, in capacitive sensor embodiments, the electronic components detect changes in capacitance and convert those changes to an electrical signal (e.g., analog or digital). In some cases, the electronic components may also amplify the electrical signal. FIG. 1B is one schematic circuit diagram representative of an arrangement of the electronic components on a capacitive microsensor that converts capacitance change to current change. It should be understood that other arrangements of electronic components may also be suitable including arrangements that convert capacitance change to voltage change or frequency change.

In some embodiments, the MEMS structures of the present invention are connected to electrical components (e.g., circuitry) external of the structure (i.e., non-integrated with the structure). The external electrical components may further process the electrical signals received from electrical components 14. For example, in capacitive microsensor embodiments that include integrated electrical components 14 that convert capacitance change to current change, the external circuitry may further process the change in current to provide a desired output. The desired output may be displayed and/or transmitted to a device and/or communicated to a user. For example, the desired output may be a display of the measured condition (e.g., pressure).

Having the electronic components integrated with the micromechanical components on the same MEMS structure can lead to a number of advantages including improving performance resulting from the proximity of electronic and micromechanical components, facilitating packaging, and increasing design flexibility. Particularly in capacitive microsensor applications, in which changes in capacitance may be extremely small, it is advantageous to have the electronic components proximate to the micromechanical components to reduce parasitic capacitive signal loss. The improved performance of integrated MEMS sensors of the present invention, for example, can enable measuring very low pressures (e.g., less than 1 psi).

As noted above, FIG. 1A illustrates a microsensor. During operation, diaphragm 27 is movable in response to a condition being measured (e.g., pressure, flow). The diaphragm moves relative to a conducting region 32, for example, in the direction(s) of the arrow. Movement of the diaphragm relative to the conducting region 32 results in a change in capacitance when a voltage is applied between the diaphragm and the conducting region. This change in capacitance may be detected and converted into an electrical signal (e.g., current, voltage, or frequency) by electronic components 14, as described further above. The electrical signal may be related to the distance that the diaphragm moves which, in turn, may be related to the condition being measured. In this way, the sensor may be calibrated to characterize the condition. For example, the sensor may be used to measure fluid pressure by measuring the electrical signal change resulting from movement of the component caused by the fluid pressure.

Sensors of the invention may be used to characterize a variety of conditions. For example, sensors of the invention may be used to measure pressure, acceleration, stress and flow (e.g., mass flow), amongst other conditions. Pressure sensors of the invention, for example, may be used to measure the pressure in an exhaust stream (e.g., from an engine). Also, flow sensors of the invention may be used to measure mass flow in an exhaust stream. It should be understood that the pressure sensors may be used to characterize conditions in any suitable environment including fluids, such as liquids or gases.

It should be understood that, in some embodiments, the microsensors of the invention may be piezoresistive sensors. In these embodiments, movement of the diaphragm causes a corresponding change in the resistance of piezoresistive elements in the structure which can be measured. The change in resistance may be related to the distance that the diaphragm moves which, in turn, may be related to the condition.

FIG. 2 schematically illustrates a microactuator according to one embodiment of the invention. The illustrated microactuator is a micromotor. During operation, the electronic components send an electrical signal (e.g., current, voltage) to the micromechanical components. The electrical signals, for example, may generate electrostatic forces that attract the micromechanical components (or portions thereof) which results in a desired motion. Other types of microactuators known in the art are also within the scope of the invention including micromirrors and microvalves.

Though FIGS. 2 and 3 respectively illustrate a microsensor and a microactuator, it should be understood that other device applications are within the scope of the present invention.

As noted above, in many embodiments, MEMS structures of the invention advantageously may be used in extreme conditions. The performance under such conditions depends primarily on the materials used to form the micromechanical components and, in many cases, the substrate. MEMS structures that include silicon carbide-based micromechanical components and silicon carbide substrates may be operated in conditions of up to about 600° C. Such structures are also suitable for use in corrosive environments (e.g., acidic, basic) or environments that experience rapid vibrations. MEMS structures that include silicon carbide-based micromechanical components and SOI substrates may be operated in conditions of up to about 300° C.

It should be understood that the above-described temperatures reflect the temperature of the entire structure when operating. This differs from certain conventional MEMS structures (e.g., silicon-based structures) that may allegedly be capable of operating at high temperatures, though in many of these cases, the entire structure is incapable of withstanding such high temperatures. In these conventional structures, complex packaging and/or other cooling mechanisms may be employed to shield all, or sections, of the structure from the high temperatures. Also, these conventional structures may be positioned a distance away from the high temperature source so that the all of (or a portion of) the structure does not reach the high temperature. Because MEMS structures of the invention can withstand such high temperatures, complex packaging and/or cooling mechanisms are not required in many cases. The MEMS structures of the invention also may be positioned closer to high temperature sources than certain conventional structures which, for example, can increase the accuracy of measurements made by the structure. For example, exhaust mass flow and pressure sensors may be positioned closer to the high temperature source (e.g., ignition source) in an engine than such conventional structures, thus, providing more accurate mass flow and pressure measurements.

Other embodiments of the invention include methods of using MEMS structures at elevated temperatures. One method includes operating any suitable MEMS structure described herein at temperatures of greater than about 125° C., such as between about 125° C. and about 250° C., or between about 125° C. and about 600° C. For example, structures including SOI substrates may be operated between about 125° C. and about 250° C. and structures including silicon carbide substrates may be operated between about 125° C. and about 600° C.

It should be understood that the above-described MEMS structures may also be used at temperatures below the above-described ranges (e.g., less than 125° C.).

Other embodiments of the invention include methods of operating suitable MEMS structures of the invention at acidic (e.g., pH<5) or basic (e.g., pH>9) conditions.

Other embodiments of the invention include methods of operating suitable MEMS structures of the invention at rapid vibration conditions.

It should be understood that the term "operating", as used herein, may include any of the operations that MEMS structures described here perform. Operating may include sensing or measuring (e.g., in microsensor applications), moving (e.g., in microactuator applications), and the like.

Methods of forming MEMS structures of the invention typically involve the following general process steps: forming electrical connections 20, forming micromechanical components 12 and forming electronic components 14. The order of these general processing steps may vary depending on the method. Some methods involve forming (at least a portion of) the electrical connections, followed by forming the micromechanical components, followed by forming the electronic components (as shown in FIGS. 3A-5). In these methods, a second portion of the electrical connections may be formed after the electronic components are formed (as shown in FIG. 6). Other methods involve forming the micromechanical components, followed by forming the electrical connections, followed by forming the electronic components.

Figure 3A:
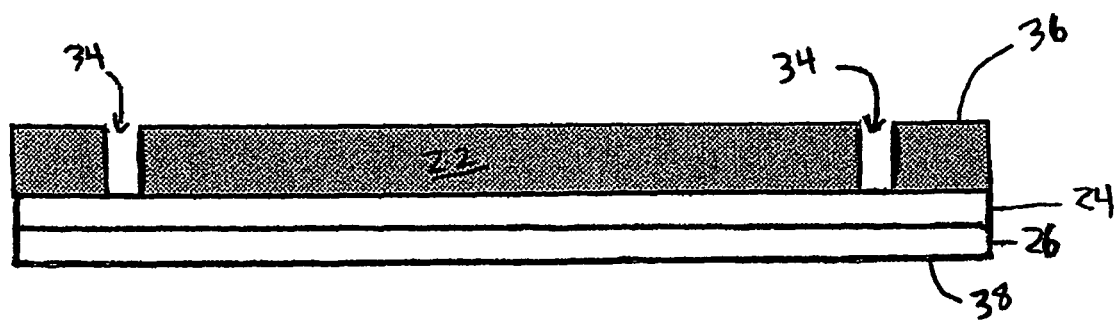
FIGS. 3A-3B are respective cross-sections of a structure at different stages during the formation of electrical connections according to one method of the present invention.

Electrical connections 20 may be formed using a series of steps that use known processes. The first step in forming the electrical connections involves forming a via 34 that extends from a first surface 36 of substrate 22 as shown in FIG. 3A. Via 34 extends from the first surface to insulator region 24 of the SOI substrate in the illustrative embodiment. In a subsequent process step, another via may be formed that extends from a second surface 38 to connect with the portion of the electrical connection formed in the first via as described further below. It should be understood that, in other methods, via 34 may extend through the entire substrate.

Via 34 may be formed using suitable techniques known in the art. For example, the via may be formed using an etching process. The process may involve wet etching using appropriate chemical solutions, or dry etching using a plasma. In some cases, a reactive ion etching (RIE) process may be preferred.

Though the vias are illustrated as having parallel sidewalls, in other embodiments the vias may have sloped sidewalls, for example, such that the cross-sectional area of the via decreases in a direction away from first surface 36. The shape of the via may depend, at least in part, on the technique used to form the via.

Figure 3B:
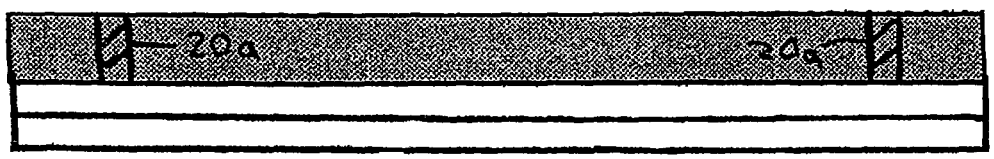

As shown in FIG. 3B, a first portion 20a of the electrical connection is deposited within via 34. It should be understood that in methods in which via 34 extends through the entire substrate, then the entire electrical connection may be deposited within the via in this deposition step.

Suitable deposition techniques known in the art may be used and the deposition technique may depend, in part, on the composition of the electrical connection. For example, evaporation, sputtering or electroplating techniques may be used to deposit metal electrical connections; chemical vapor deposition techniques may be used to deposit metal compound electrical connections; and, chemical vapor deposition techniques (e.g., LPCVD) may be used to deposit in-situ doped semiconductor material.

Micromechanical components 12 may be formed using a variety of techniques including etching (e.g., RIE), micromolding and lift-off. In some cases, for example when the components have a complex structure, it may be preferred to use a micromolding technique. Micromolding involves the deposition of a series of silicon carbide layers which are patterned to form the desired structures using sacrificial mold layers (e.g., formed of polysilicon or silicon oxide), as described further below. The sacrificial mold layers are removed to release the silicon carbide patterned structures thereby forming the micromechanical components.

One example of a typical micromolding process is illustrated with reference to the cross-sections shown in FIGS. 4A-4J. Those of ordinary skill in the art would understand variations to the illustrated micromolding process which are intended to be within the scope of the present invention.

Figure 4A:
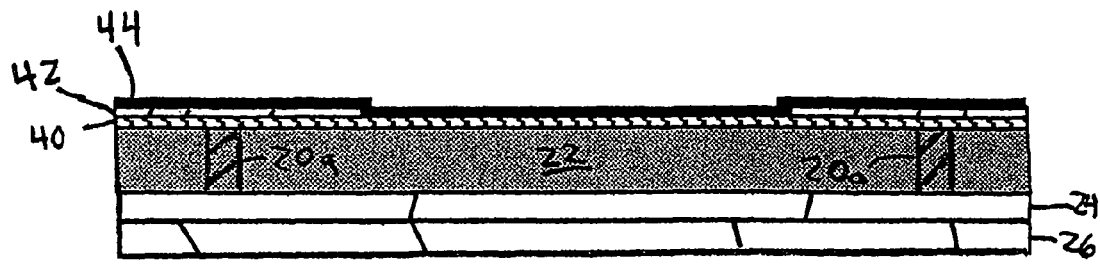
FIGS. 4A-4J are respective cross-sections of a structure at different stages during the formation of micromechanical components according to one method of the present invention.

FIG. 4A illustrates a cross-section of the structure after the following steps: deposition of a nitride layer 40 on substrate 22, deposition and patterning of a silicon oxide layer 42 on the nitride layer, and deposition of a silicon carbide layer 44 on the silicon oxide layer. The nitride layer, silicon oxide layer and silicon carbide layer may, for example, be deposited using conventional chemical vapor deposition techniques. In certain preferred embodiments, the deposition conditions are selected to deposit polycrystalline silicon carbide. For example, the deposition temperature may be between about 650° C. and about 950° C. Suitable gas sources for polycrystalline silicon carbide deposition include dichlorosilane, as the silicon source, and acetylene as the carbon source. In some methods of the invention, the silicon carbide layer may be doped, for example, by introducing a dopant source (e.g., nitrogen) into the process chamber along with the silicon source and carbon source.

Figure 4B:
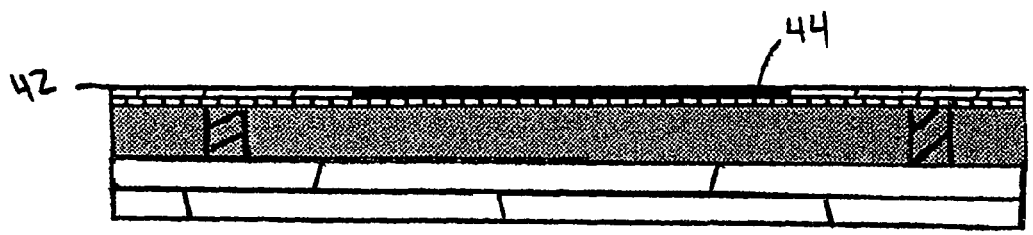

FIG. 4B illustrates a cross-section of the structure after a planarization step in which silicon carbide layer 44 is polished to be co-planar with patterned silicon oxide layer 42. Polishing may be accomplished using a chemical-mechanical polishing technique.

Figure 4C:
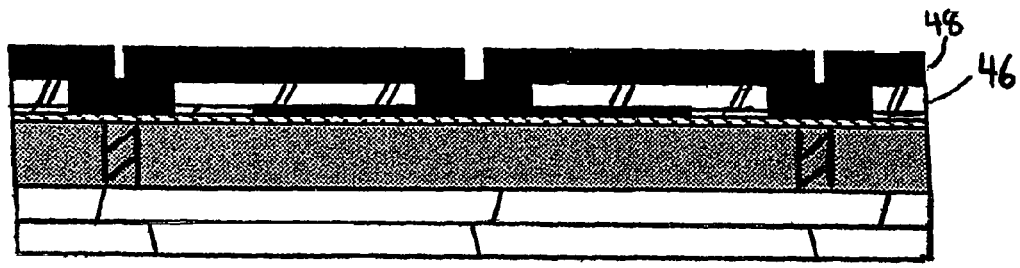

FIG. 4C illustrates a cross-section of the structure after the following steps: deposition and patterning of a second silicon oxide layer 46 on the planarized surface and deposition of a second silicon carbide layer 48 on the patterned second silicon oxide layer. The second silicon oxide layer and second silicon carbide layer may, for example, be deposited using conventional chemical vapor deposition techniques. In certain preferred embodiments, the deposition conditions are selected to deposit polycrystalline silicon carbide. The second silicon carbide layer may have a thickness, for example, between about 1.0 micron and about 5.0 microns (e.g., about 2.0 micron). In some methods of the invention, the silicon carbide layer may be doped as described above.

Figure 4D:
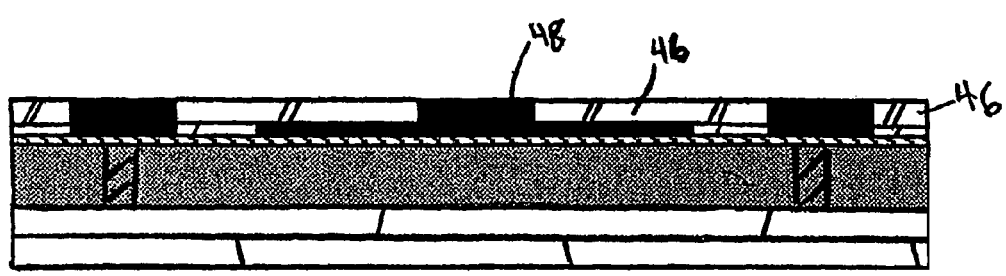

FIG. 4D illustrates a cross-section of the structure after a planarization step in which second silicon carbide layer 48 is polished to be co-planar with the patterned second silicon oxide layer 46. Polishing may be accomplished using a chemical-mechanical polishing technique.

Figure 4E:
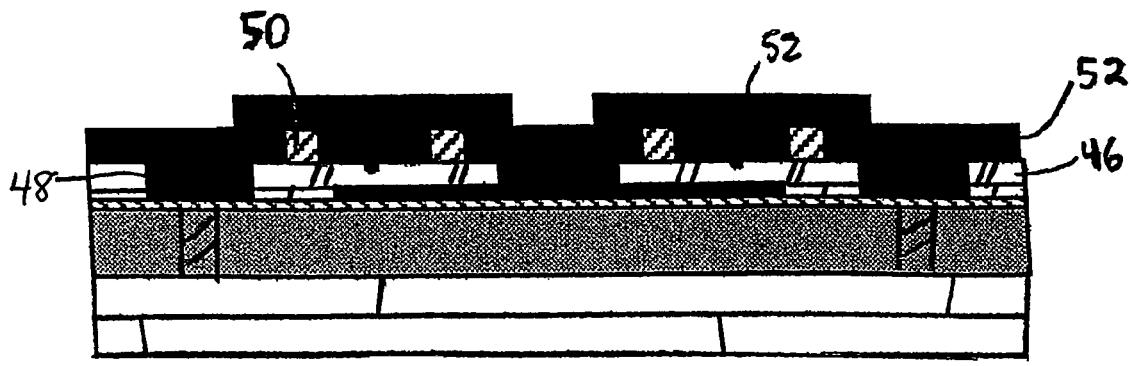

FIG. 4E illustrates a cross-section of the structure after the following steps: etching dimples in the second silicon oxide layer, deposition and patterning of a polysilicon layer 50, and deposition of a third silicon carbide layer 52 on the patterned polysilicon layer. The polysilicon layer and third silicon carbide layer may, for example, be deposited using conventional chemical vapor deposition techniques. In certain preferred embodiments, the deposition conditions are selected to deposit polycrystalline silicon carbide. The third silicon carbide layer may have a thickness, for example between about 1.0 micron and about 5.0 microns (e.g., about 2.0 micron). In some methods of the invention, the silicon carbide layer may be doped as described above.

Figure 4F:
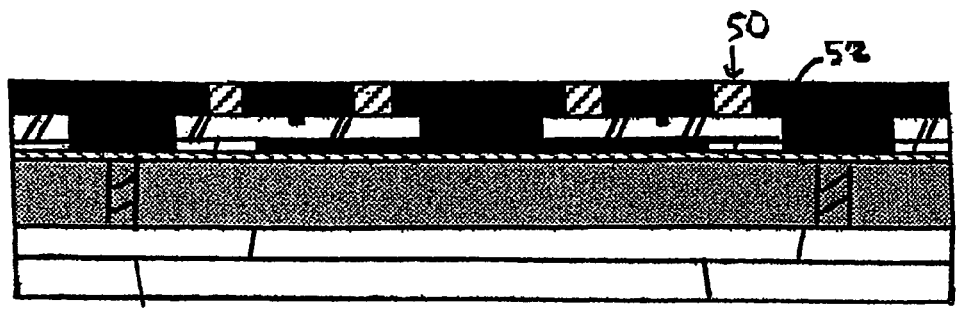

FIG. 4F illustrates a cross-section of the structure after a planarization step in which third silicon carbide layer 52 is polished to be co-planar with the patterned polysilicon layer 50. Polishing may be accomplished using a chemical-mechanical polishing technique.

Figure 4G:
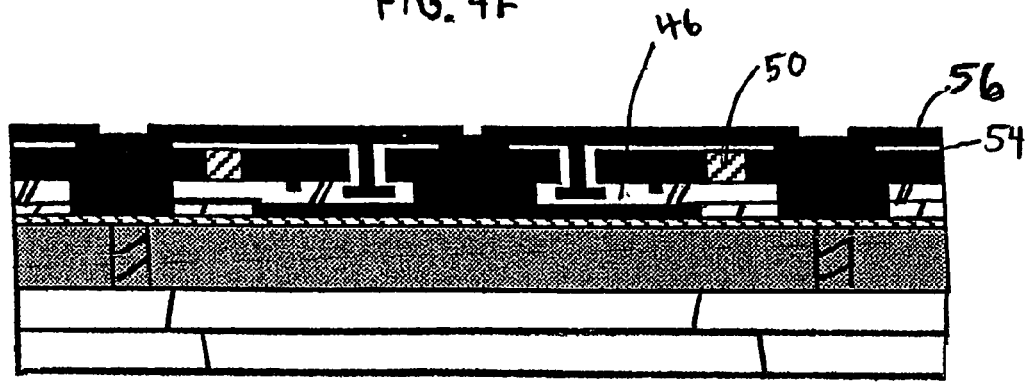

FIG. 4G illustrates a cross-section of the structure after the following steps: etching vias that extend through patterned polysilicon layer 50 and into second silicon oxide layer 46, deposition and patterning of a third silicon oxide layer 54, deposition of a fourth silicon carbide layer 56. The third silicon oxide layer and fourth silicon carbide layer may, for example, be deposited using conventional chemical vapor deposition techniques. In certain preferred embodiments, the deposition conditions are selected to deposit polycrystalline silicon carbide. The third silicon oxide layer may have a thickness, for example, between about 0.5 micron and about 1.0 micron (e.g., 0.75 micron). The fourth silicon carbide layer may have a thickness, for example, between about 1.0 micron and about 5.0 microns (e.g., 1.5 micron). In some methods of the invention, the silicon carbide layer may be doped as described above.

Figure 4H:
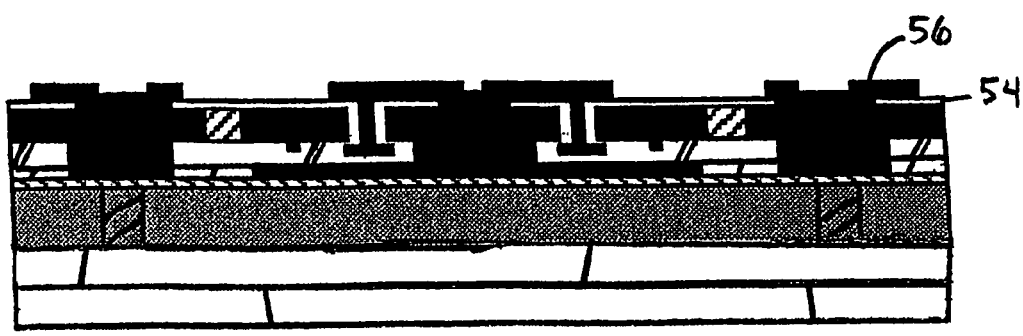

FIG. 4H illustrates a cross-section of the structure after the fourth silicon carbide layer has been patterned. The fourth silicon carbide layer may be patterned, for example, using reactive ion etching (RIE).

Figure 4I:
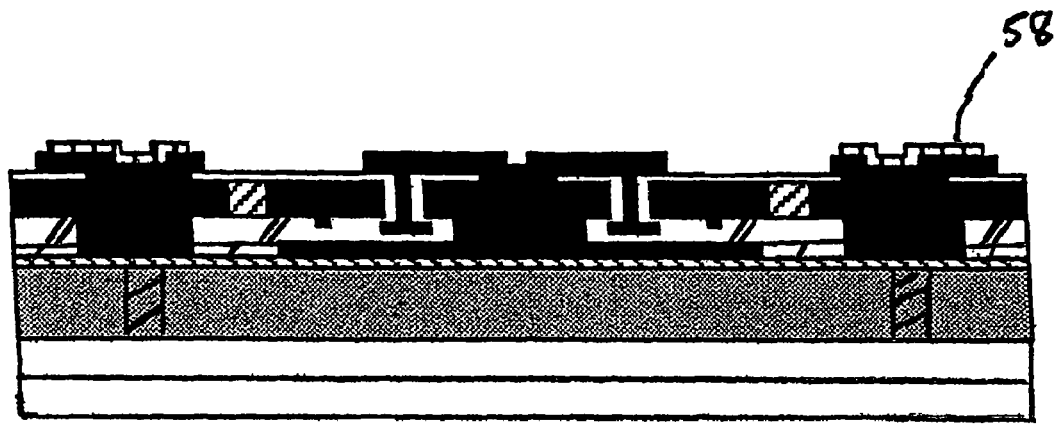

FIG. 4I illustrates a cross-section of the structure after deposition and patterning of a metal layer 58 on the patterned fourth silicon carbide layer. The metal layer may be formed of nickel. The thickness of the metal layer may be, for example, between about 0.5 micron and about 1.0 micron (e.g., 0.75 micron).

Figure 4J:
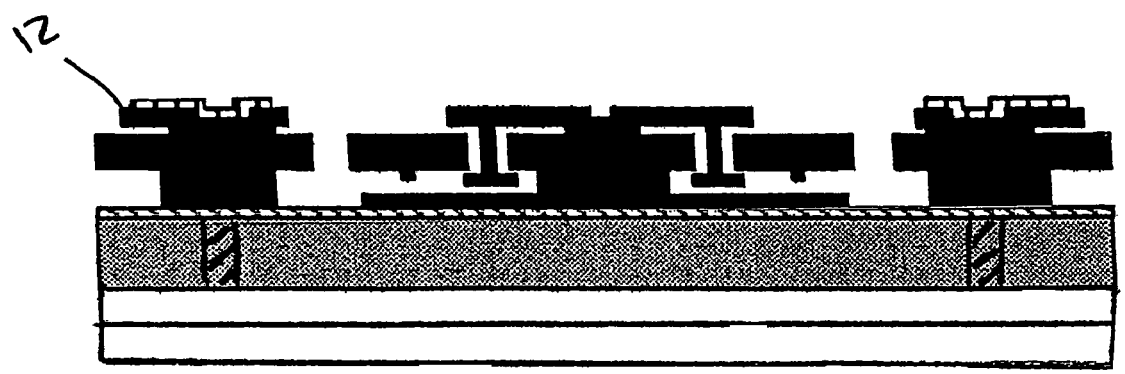

FIG. 4J illustrates a cross-section of the structure after the silicon oxide layers (42, 46, 54) and the polysilicon layer (50) have been removed, for example, using an etching technique. The remaining silicon carbide and nickel structures form micromechanical components 12.

It should be understood that micromechanical components having a structure different than those illustrated in FIGS. 4A-4J may also be formed using micromolding processes and that the process steps could be modified accordingly.

Also, it should be understood that processes other than micromolding (e.g., deposition and etching) may be used to form the micromechanical components of the invention.

Figure 5:
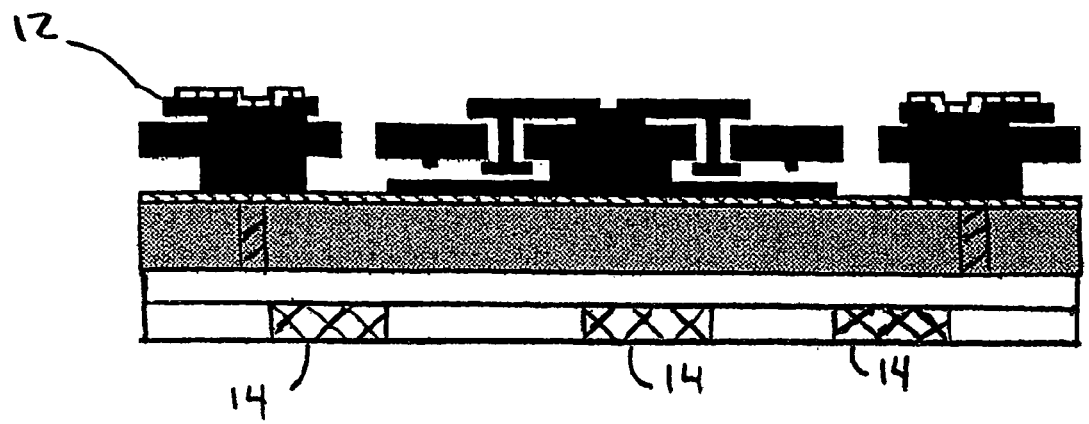
FIG. 5 is a cross-section of a MEMS structure after formation of the electronic components according to one method of the present invention.
Figure 6:
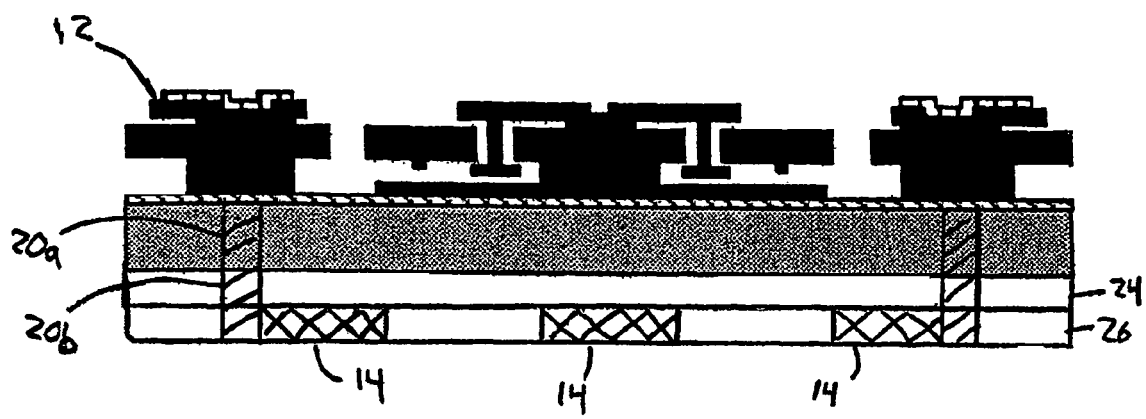
FIG. 6 is a cross-section of a MEMS structure after completion of the electrical connections according to one method of the present invention.

FIG. 5 illustrates a cross-section of the structure after the formation of electronic components 14. Known processing techniques may be used to form the electronic components including implantation, photolithographic patterning, etching and deposition steps.

FIG. 6 illustrates a cross-section of the structure after formation of second portion 20b of the electrical connections. Second portion 20b may be formed by etching a via that extends from backside 18 of the substrate to first portion 20a of the electrical connection. In the illustrative embodiment, the via extends from the backside and through silicon surface region 26 and buried insulator region 24. The second portion of the electrical connection is then deposited in the via to form a conducting pathway between the electronic components and the micromechanical components.

As noted above, the order of the general processing steps of the methods of the invention (e.g., forming the micromechanical components, forming the electrical connections, and forming the electronic components) may vary.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. An integrated MEMS structure comprising:
   a substrate;
   a micromechanical component including a mechanically-active member, wherein said mechanically-active member is substantially metal-free and comprises silicon carbide; and
   at least one electronic component electrically connected to the micromechanical component,
   wherein the at least one electronic component is capable of controlling or detecting movement of the micromechanical component.

2. The structure of claim 1, wherein the structure is a capacitive sensor.

3. The structure of claim 1, wherein the micromechanical component is movable in response to a condition.

4. The structure of claim 3, further comprising a conducting region coupled to the micromechanical component such that movement of the micromechanical component relative to the conducting region changes the capacitance between the conducting region and the micromechanical component.

5. The structure of claim 4, wherein the at least one electronic component processes signals related to the change in capacitance.

6. The structure of claim 1, comprising a plurality of electronic components that are a series of semiconductor devices.

7. The structure of claim 1, wherein the substrate is an SOI substrate.

8. The structure of claim 1, wherein the substrate is a silicon carbide substrate.

9. An integrated capacitive pressure sensor comprising:
   a substrate;
   a micromechanical component including a mechanically-active member, wherein said mechanically-active member is substantially metal-free and comprises silicon carbide;
   a conducting region coupled to the micromechanical component such that movement of the micromechanical component relative to the conducting region changes the capacitance between the conducting region and the micromechanical component; and
   at least one electronic component designed to processes signals related to the change in the capacitance.

10. The structure of claim 1 wherein said mechanically-active member consists essentially of silicon carbide.

11. The structure of claim 1 wherein said mechanically-active member consists of silicon carbide.

12. The structure of claim 9 wherein said mechanically-active member consists essentially of silicon carbide.

13. The structure of claim 9 wherein said mechanically-active member consists of silicon carbide.

* * * * *